US006404294B1

(12) United States Patent
Sha et al.

(10) Patent No.: US 6,404,294 B1
(45) Date of Patent: Jun. 11, 2002

(54) VOLTAGE CONTROL OSCILLATOR (VCO) WITH AUTOMATIC GAIN CONTROL

(75) Inventors: I-Teh Sha, Santa Clara; Kuang-Yu Chen, Saratoga; Trung Tran, Sunnyvale, all of CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/618,706

(22) Filed: Jul. 18, 2000

(51) Int. Cl.[7] .............................. H03B 5/24; H03L 7/099
(52) U.S. Cl. ........................................... 331/57; 331/10
(58) Field of Search ................................ 331/1 A, 2, 8, 331/10, 17, 18, 25, 23, 57

(56) References Cited

U.S. PATENT DOCUMENTS

| 5,412,349 A | | 5/1995 | Young et al. ................. 331/34 |
| 5,459,653 A | * | 10/1995 | Seto et al. ..................... 363/73 |
| 5,748,048 A | | 5/1998 | Moyal ........................... 331/34 |
| 5,896,068 A | | 4/1999 | Moyal ........................... 331/34 |
| 6,005,444 A | | 12/1999 | Carpelan ....................... 331/16 |

* cited by examiner

Primary Examiner—David Mis
(74) Attorney, Agent, or Firm—Christopher P. Malorana, P.C.

(57) ABSTRACT

An apparatus comprising a first circuit and a second circuit. The first circuit may be configured to generate an output signal having a frequency that varies in response to (i) a voltage signal and (ii) a load. The second circuit may be configured to generate the load by coupling one or more resistive devices to a reference node in response to a control signal.

20 Claims, 13 Drawing Sheets

VOLTAGE CONTROL OSCILLATOR (VCO) WITH AUTOMATIC GAIN CONTROL

CROSS-REFERENCE TO RELATED APPLICATIONS

The present invention may relate to co-pending application U.S. Ser. No. 09/618,622, filed concurrently, which is hereby incorporated by reference in its entirety.

FIELD OF THE INVENTION

The present invention relates to a method and/or architecture for a voltage controlled oscillator generally and, more particularly, to a method and/or architecture for an automatic gain control circuit for use with a voltage controlled oscillator.

BACKGROUND OF THE INVENTION

A voltage controlled oscillator (VCO) is commonly employed in a variety of applications, including communications, and timing circuitry. In particular, a VCO is commonly used in phase locked loop (PLL) control systems. Functionally, a VCO may be viewed as a circuit that seeks to transform an input control voltage signal into an output frequency signal in a substantially linear fashion. The frequency gain of a VCO typically defines the relationship between changes in the output frequency relative to predetermined changes in the input control voltage signal (i.e., delta frequency/delta voltage).

Referring to FIG. 1, a graph illustrating a linear frequency gain is shown. The linear relationship between the frequency of the signal FOUT and the magnitude of the voltage signal VIN may be expressed using the following equations:

$$\frac{df}{dv} = m$$

$$\int_{f0}^{fn} df = m \int_{v0}^{vn} dv$$

$$f_n = m(v_n - v_0) + f_0$$

where m is the constant VCO gain, f0 and v0 are the initial values of the frequency of the signal FOUT, and fn and vn are the output frequency and the input voltage.

Referring to FIG. 2, a block diagram of a linear VCO 10 is shown. The VCO 10 includes an output stage 12 and an input stage 14. The output stage 12 transforms a control current Ic into an output signal FOUT having a predetermined frequency based on the magnitude of the control current Ic. The input stage 14 converts an input voltage VIN into the control current Ic. For example, the output stage 12 can include a plurality of differential current switches connected in series with an output of a last current switch connected to an input of a first current switch (i.e., a so-called ring oscillator). The control current Ic is mirrored into the plurality of current switches controlling the output frequency (i.e., controlling the biasing current), or, alternatively, the magnitude of the control current is used to control a load associated with the plurality of current switches thereby varying the output frequency of the VCO.

The input stage 14 includes a transistor 16 and a transistor 18. The signal VIN is presented to a gate of the transistor 16. A resistor 20 couples a source of the transistor 16 to a voltage supply ground VSS. A drain of the transistor 16 is connected to a drain and a gate of the transistor 18. A source of the transistor 18 is connected to a supply voltage VCC. A voltage across the resistor 20 varies in response to the signal VIN generating the control current Ic. The control current Ic is mirrored from the transistor 18 to the output stage 12. Referring to FIG. 3, a schematic diagram illustrating a transistor implementation of the circuit 10 is shown.

Referring to FIG. 4, a graph illustrating the frequency gain for the circuit 10 is shown. The input stage 14 of a conventional VCO has a linear response—ostensibly in order to effect a linear VCO input/output response. The resistor 20 provides a constant VCO gain that can be used with a phase lock loop (PLL) for a stable control system that is not sensitive to change.

In certain applications, the linear gain of the VCO 10 may be a disadvantage. For example, a spread spectrum application can require a VCO with a nonlinear gain (i.e., a low gain at low frequencies and a high gain at high frequencies). A description of a spread spectrum application may be found in co-pending application U.S. Ser. No. 09/618,622, filed concurrently, which is hereby incorporated by reference in its entirety. Since the gain of the circuit 10 is controlled by the resistor 20, the circuit 10 cannot achieve a nonlinear gain.

SUMMARY OF THE INVENTION

The present invention concerns an apparatus comprising a circuit configured to generate an output signal having a frequency that varies in response to a voltage signal, wherein said circuit has an automatically controlled nonlinear frequency gain.

The objects, features and advantages of the present invention include providing a method and/or architecture for automatic gain control in a voltage controlled oscillator (VCO) that may (i) provide an adaptive spread spectrum device, and/or (ii) provide a wider range of operating frequency than a conventional VCO.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 5:
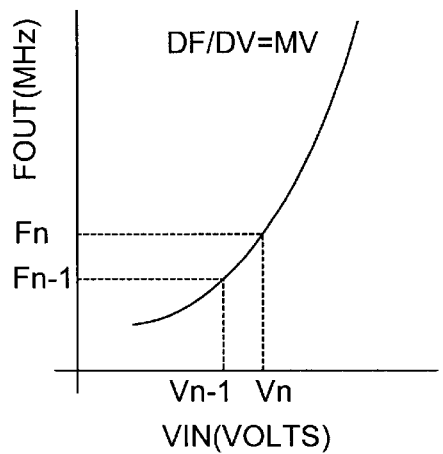
FIG. 5 is a graph illustrating parameters of a nonlinear frequency gain.

Referring to FIG. 5, a graph illustrating parameters of an automatic gain control for a VCO implemented in accordance with the present invention is shown. A VCO with automatic gain control may have a nonlinear relationship between the frequency of the signal FOUT and the magnitude of the voltage signal VIN (e.g., a frequency gain, Kvco). The nonlinear relationship may be expressed using the following equations:

$$\frac{df}{dv} = mv$$

$$\int_{f_{n-1}}^{f_n} df = m \int_{v_{n-1}}^{v_n} v\, dv$$

$$f_n = \frac{m}{2}(v_n - v_{n-1})^2 + f_{n-1}$$

where m may represent the slope of the frequency gain Kvco, f(n−1) and v(n−1) may represent a output frequency and input voltage of a previous operating point, and fn and vn may be a target frequency for a particular input voltage.

Figure 6:
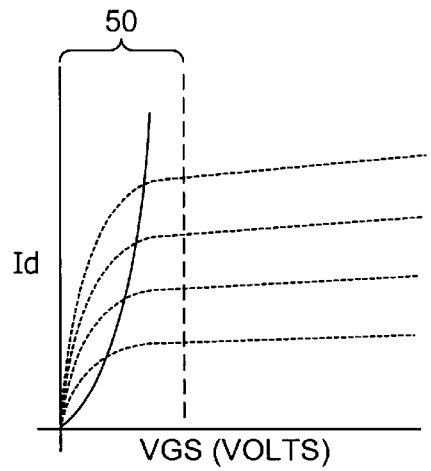
FIG. 6 is a graph illustrating operation of a MOS transistor in a linear region.

Referring to FIG. 6, a graph illustrating operating characteristics of a MOS transistor is shown. A MOS transistor may be operated in a linear region (e.g., portion 50). When the MOS transistor is operated in the linear region, the MOS transistor generally has a parabolic relationship between a drain current (e.g., Id) and a voltage between a gate and a source (e.g., Vgs). The parabolic characteristic of the MOS transistor may be used, in one example, to control the gain of a voltage controlled oscillator. The MOS transistor may be sized (e.g., operating characteristics and/or geometry adjusted) to achieve predetermined gain characteristics.

Figure 7:
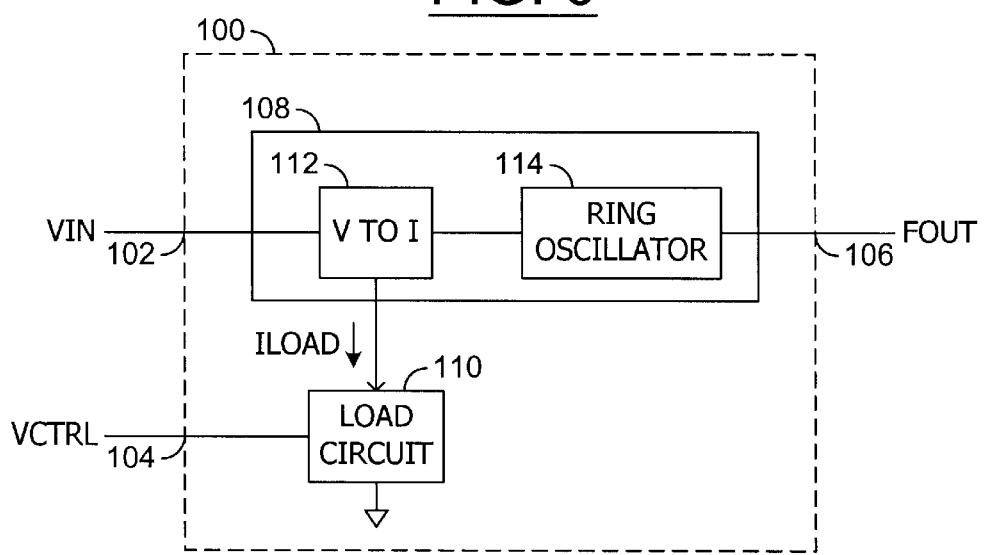
FIG. 7 is a block diagram of a circuit 100 in accordance with a preferred embodiment of the present invention.

Referring to FIG. 7, a block diagram of a circuit 100 is shown in accordance with a preferred embodiment of the present invention. The circuit 100 may be implemented, in one example, as a voltage controlled oscillator (VCO) with automatic gain control (AGC). The circuit 100 may be configured to automatically provide a predetermined VCO gain (e.g., Kvco) at each output frequency. The circuit 100 may provide a wider output frequency range than a linear VCO. The circuit 100 may be implemented, in one example, in a phase lock loop (PLL) circuit. The circuit 100 may be configured, in one example, to provide a parabolic relationship between an input voltage (e.g., VIN) and a frequency of an output signal (e.g., FOUT). In another example, the relationship may be described by a second order or higher polynomial. The nonlinear relationship between input voltage and output frequency may provide a fast rising gain that may be used to meet adaptive spread spectrum requirements.

The circuit 100 may have an input 102 that may receive the input voltage VIN, an input 104 that may receive a signal (e.g., VCTRL), and an output that may present the signal FOUT. The signal VCTRL may be, in one example, a control signal that may be used to control and/or adjust the frequency gain of the circuit 100. The signal VCTRL may be a voltage level signal, a multi-bit digital signal, or any other appropriate control signal selected to meet the design criteria of a particular application. The signal VIN may be, in one example, a control voltage generated in a phase lock loop circuit. The circuit 100 may be configured to generate the signal FOUT in response to the signals VIN and VCTRL.

The circuit 100 may comprise a circuit 108 and a circuit 110. The circuit 108 may be implemented, in one example, as a voltage controlled oscillator having a gain that may vary in response to a load current (e.g., ILOAD). The circuit 108 may be configured to generate the signal FOUT in response to the signal VIN and the signal ILOAD.

The circuit 110 may be implemented, in one example, as a load circuit. The circuit 110 may be configured to varying a load in response to the control signal VCTRL. The circuit 108 may be configured to generate the signal ILOAD in response to the signal VIN and the load presented by the circuit 110. The signal ILOAD may be, in one example, a nonlinear current signal that may be described, in one example, by a second order or higher polynomial.

The circuit 108 may comprise, in one example, a circuit 112, and a circuit 114. The circuit 112 may be implemented, in one example, as a voltage-to-current converter. The circuit 114 may be implemented, in one example, as a ring oscillator. The circuit 112 may be configured to generate the current ILOAD in response to the signals VIN and VCTRL. The circuit 114 may be configured to generate the signal FOUT in response to the signal ILOAD.

Figure 8:
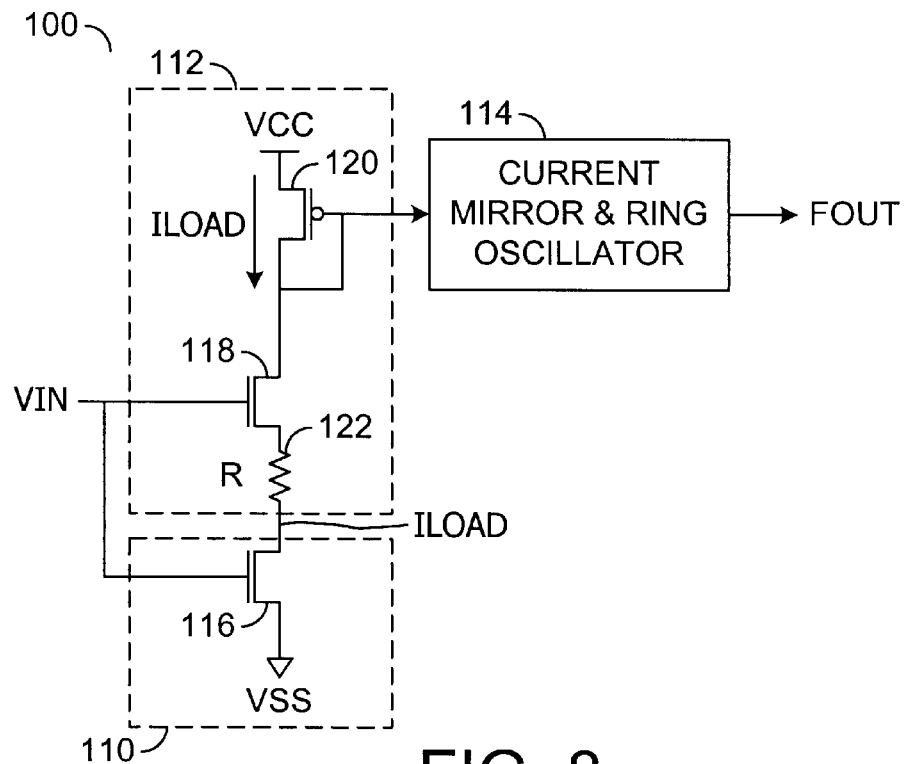
FIG. 8 is a block diagram of the circuit 100 illustrating a preferred embodiment of the present invention.

Referring to FIG. 8, a detailed block diagram of the circuit 100 illustrating a preferred embodiment of the present invention. In one example, the signal VIN may be used as the signal VCTRL. The circuit 110 may comprise, in one example, a transistor 116. The transistor 116 may be implemented, in one example, as one or more NMOS transistors. However, other types and polarity transistors may be implemented to meet the design criteria of a particular application. The signal VIN may be presented to a gate of the transistor 116. A source of the transistor 116 may be connected to a voltage supply ground (e.g., VSS) or any other appropriate reference node. The signal ILOAD may be presented at a drain of the transistor 116. The transistor 116 may be sized to provide a frequency gain curve in accordance with predetermined criteria.

The circuit 112 may comprise a transistor 118, a transistor 120, and a resistive device 122. The transistor 118 may be implemented, in one example, as one or more NMOS transistors. The transistor 120 may be implemented, in one example, as one or more PMOS transistors. However, other types and polarity transistors may be implemented to meet the design criteria of a particular application. The resistive device 122 may be implemented, in one example, as a resistor or a transistor configured to have a predetermined resistance value (e.g., R) . The signal VIN may be presented to a gate of the transistor 118. A drain of the transistor 118 may be connected to a drain and a gate of the transistor 120. A source of the transistor 118 may be connected to a first terminal of the resistive device 122. A source of the transistor 120 may be connected to a supply voltage (e.g., VCC). The signal ILOAD may be presented at the drain of the transistor 120. The transistor 120 may be implemented, in one example, as part of a current mirror of the circuit 114. The signal ILOAD may be presented at a second terminal of the resistive device 122.

Figure 9:
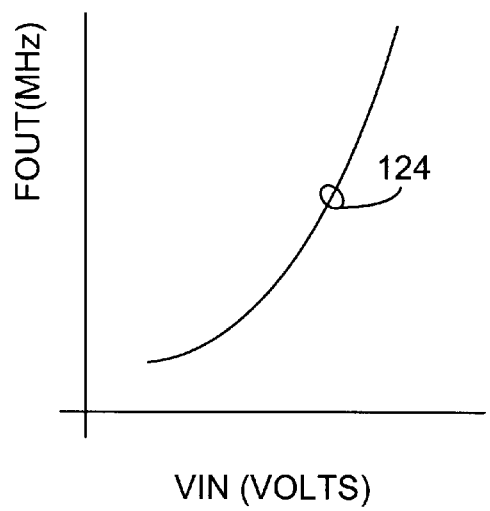
FIG. 9 is a graph illustrating an example operation of the circuit 100 of FIG. 8.

Referring to FIG. 9, a graph illustrating an example of the signal FOUT as generated by the circuit 100 of FIG. 8 is shown. The signal FOUT may have a frequency that may vary nonlinearly in response to the signal VIN (e.g., trace 124).

Figure 10:
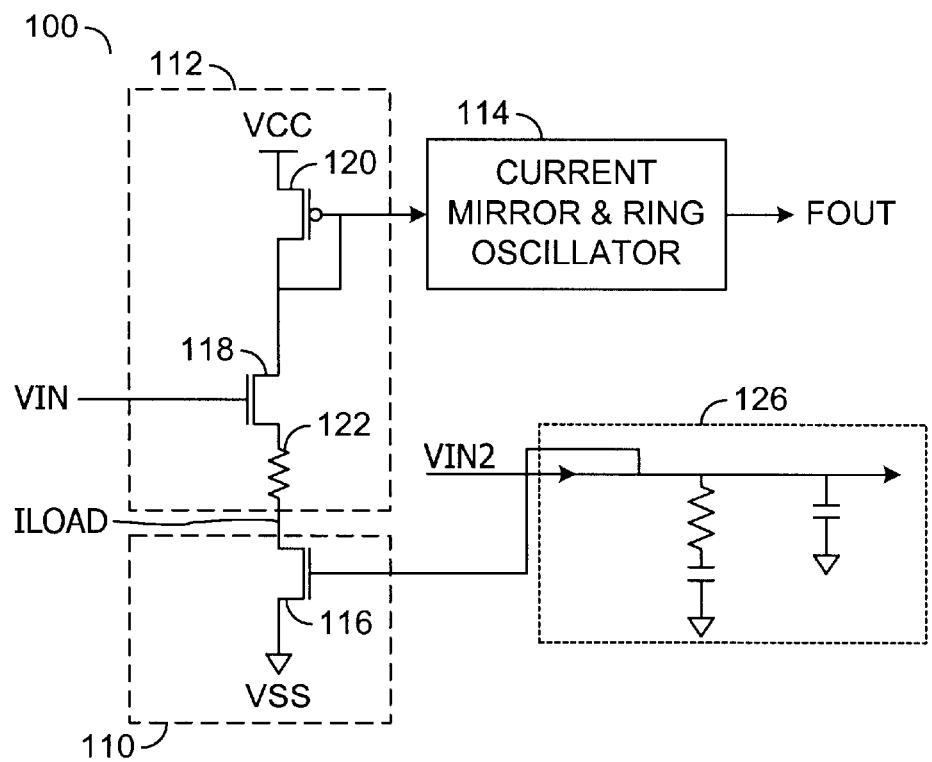
FIG. 10 is a block diagram of the circuit 100 illustrating an alternate embodiment of the present invention.

Referring to FIG. 10, a detailed block diagram of the circuit 100 illustrating an alternative preferred embodiment of the present invention is shown. The signal VIN may contain, in one example, a noise component. When the signal VIN contains a noise component, using the signal VIN to control the circuit 110 may allow the noise component to modulate the signal FOUT. Modulation of the signal FOUT by noise contained in the signal VIN may be avoided, in one example, by using a control voltage (e.g., VIN_2) of a second PLL circuit 126 to generate the signal VCRTL.

Figure 11:
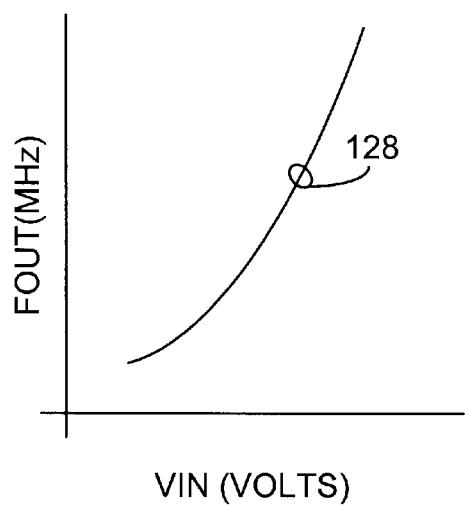
FIG. 11 is a graph illustrating an example operation of the circuit 100 of FIG. 10.

Referring to FIG. 11, a graph illustrating an example frequency gain of the circuit 100 when the signal VCRTL is generated by a second PLL is shown. The circuit 100 may have a nonlinear frequency gain (e.g., trace 128).

Figure 12:
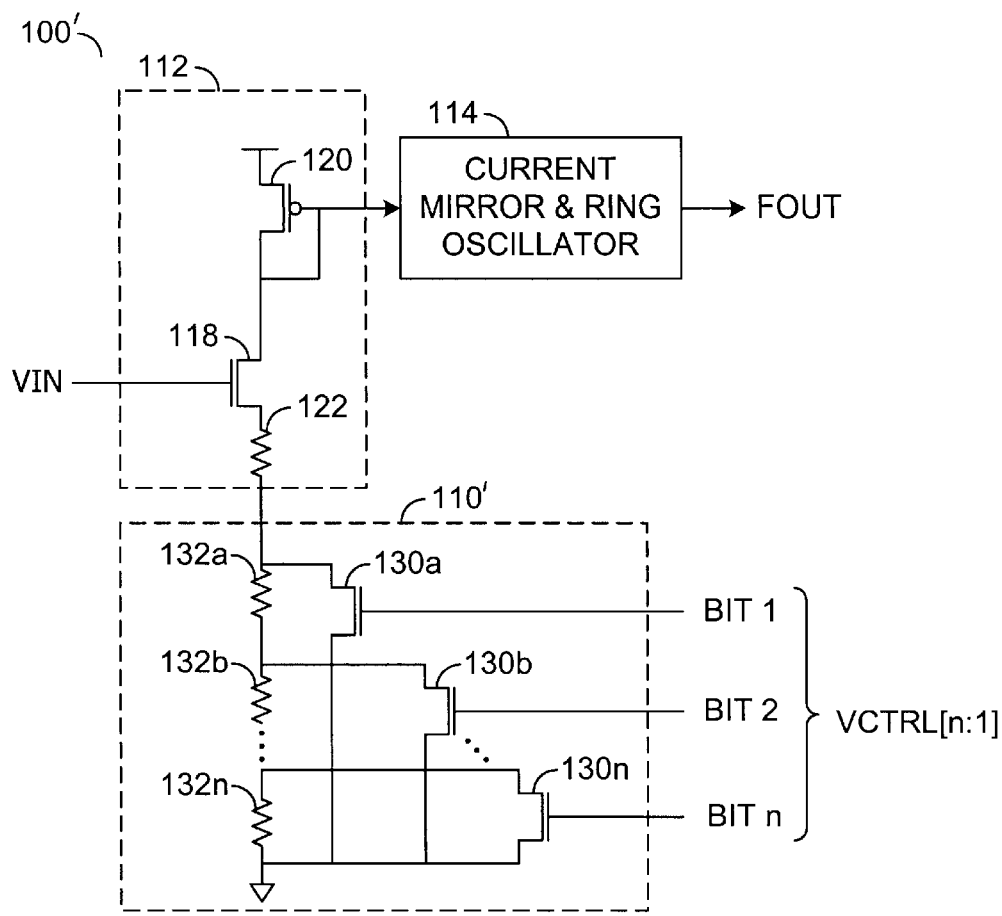
FIG. 12 is a block diagram of the circuit 100' illustrating another alternate embodiment of the present invention.

Referring to FIG. 12, a block diagram of a circuit 100' illustrating another alternative embodiment of the present invention is shown. The circuit 100' may be implemented similarly to the circuit 100 except for a load circuit 110'. The signal VCTRL may be implemented, in one example, as a multi-bit digital control signal. For example, the signal VCTRL may be an N-bit control signal (e.g., VCTRL[N:1]) in accordance with the I²C standard which is hereby incorporated by reference in its entirety.

The load circuit 110' may comprise a number of transistors 130a–130n and a number of resistive devices 132a–132n. The transistors 130a–130n may be implemented, in one example, as one or more NMOS transistors. However, other types and polarity transistors may be implemented to meet the design criteria of a particular application. The resistive devices 132a–132n may be implemented, in one example, as resistors or transistors configured to have a predetermined resistance value (e.g., R$a$–R$n$, respectively). The resistance values R$a$–R$n$ may be the same or different. A drain of the transistors 130a–130n may be connected to a terminal of a respective resistive device 132a–132n. A source of the transistors 130a–130n may be connected to the voltage supply ground VSS or any other appropriate reference node. The bits (e.g., BIT1–BITN) of the signal VCTRL[N:1] may be presented to a gate of the transistors 130a–130n, respectively.

The resistive devices 132a–132n may be connected in series (e.g., a second terminal of device 132a connected to a first terminal of device 132b, a second terminal of device 132b connected to a first terminal of device 132c, . . . , and a second terminal of device 132(n−1) connected to a first terminal of device 132n). A second terminal of the device 132n may be connected to the voltage supply ground VSS or any other appropriate reference node. The signal ILOAD may be presented to a second terminal of the resistive device 132a.

Figure 13:
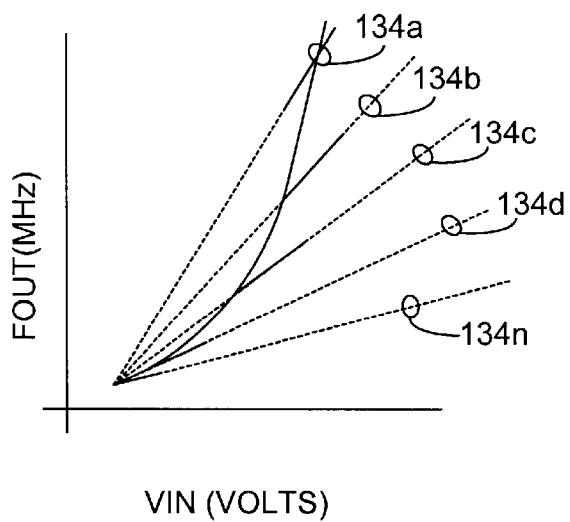
FIG. 13 is a graph illustrating an operation of the circuit 100 of FIG. 12.

Referring to FIG. 13, a line graph illustrating an example frequency to voltage relationship of the circuit 100' is shown. The circuit 100' may be configured to generate a nonlinear frequency gain that may be an approximation of a second order or higher polynomial. The circuit 100' may be configured to select one of a number of linear gain curves (e.g., traces 134a–134n) in response to the signal VCTRL. The quality of the approximation may be determined, in one example, by the number of bits of the signal VCTRL.

Figure 1:
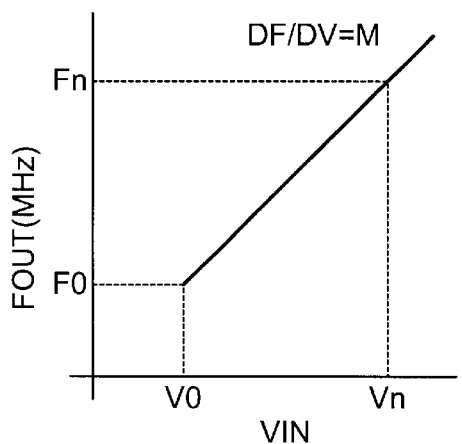
FIG. 1 is a graph illustrating parameters of a linear frequency gain.
Figure 2:
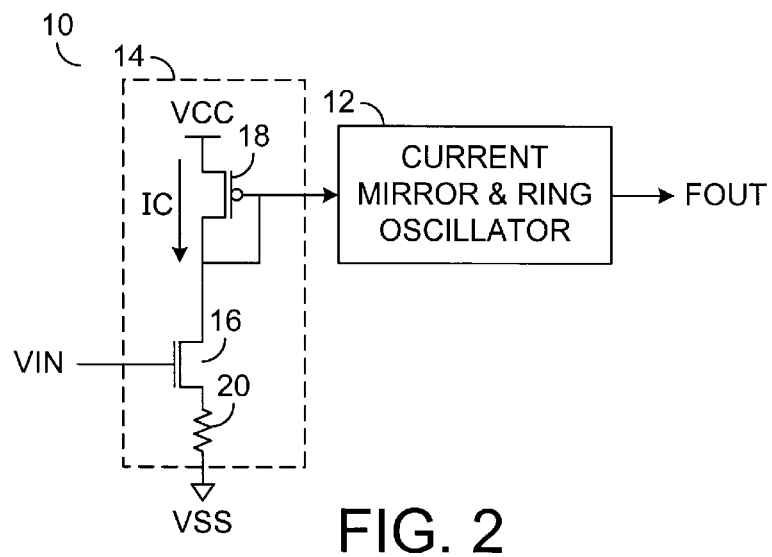
FIG. 2 is a block diagram of a linear VCO.
Figure 4:
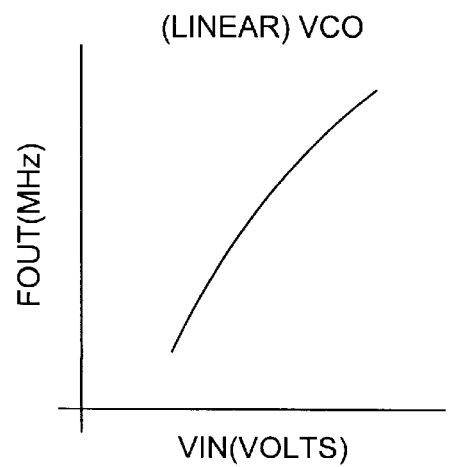
FIG. 4 is a graph illustrating a frequency versus input voltage relationship of the circuit of FIGS. 2 and 3.
Figure 3:
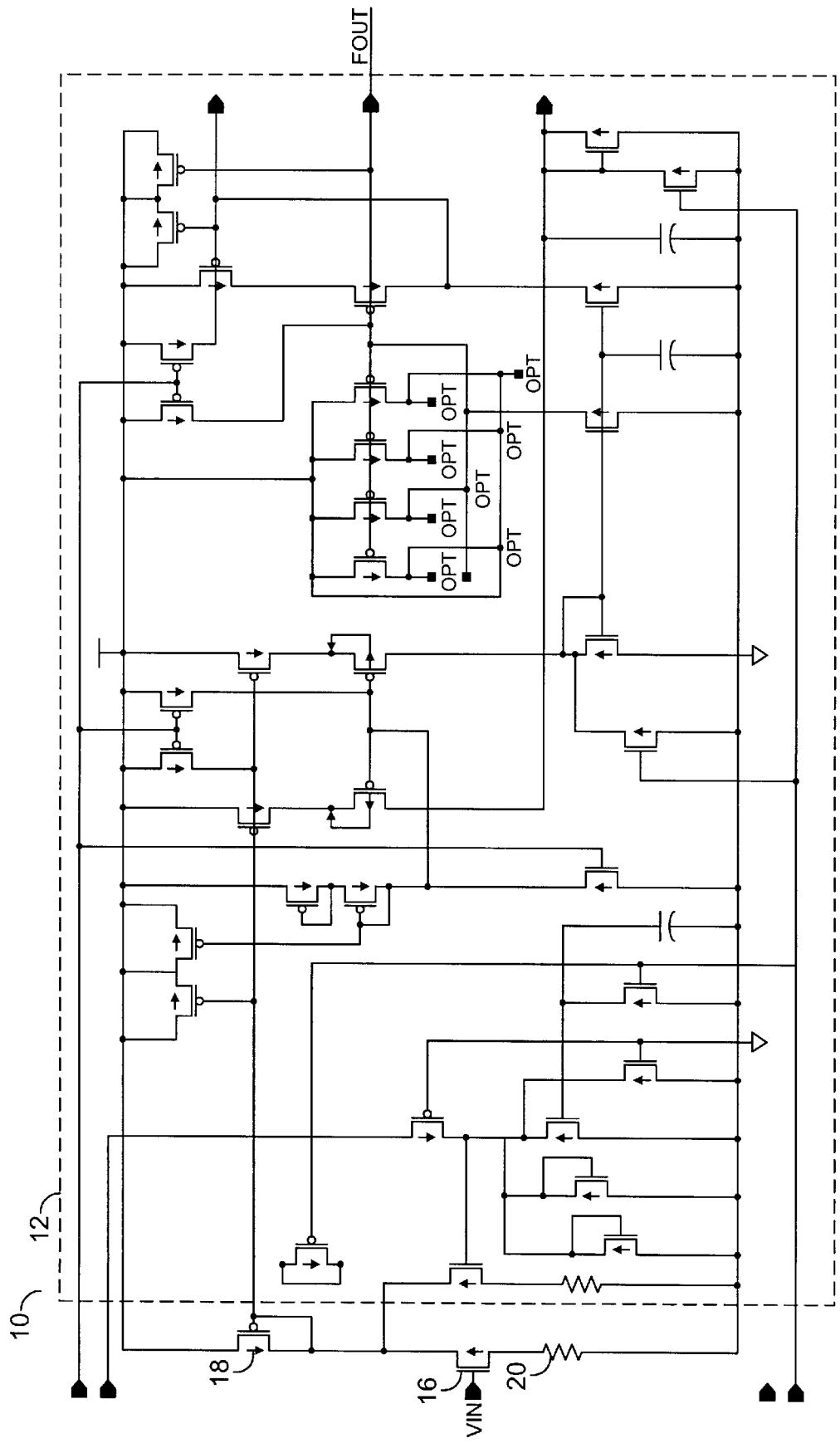
FIG. 3 is a schematic diagram of the circuit of FIG. 2.
Figure 14:
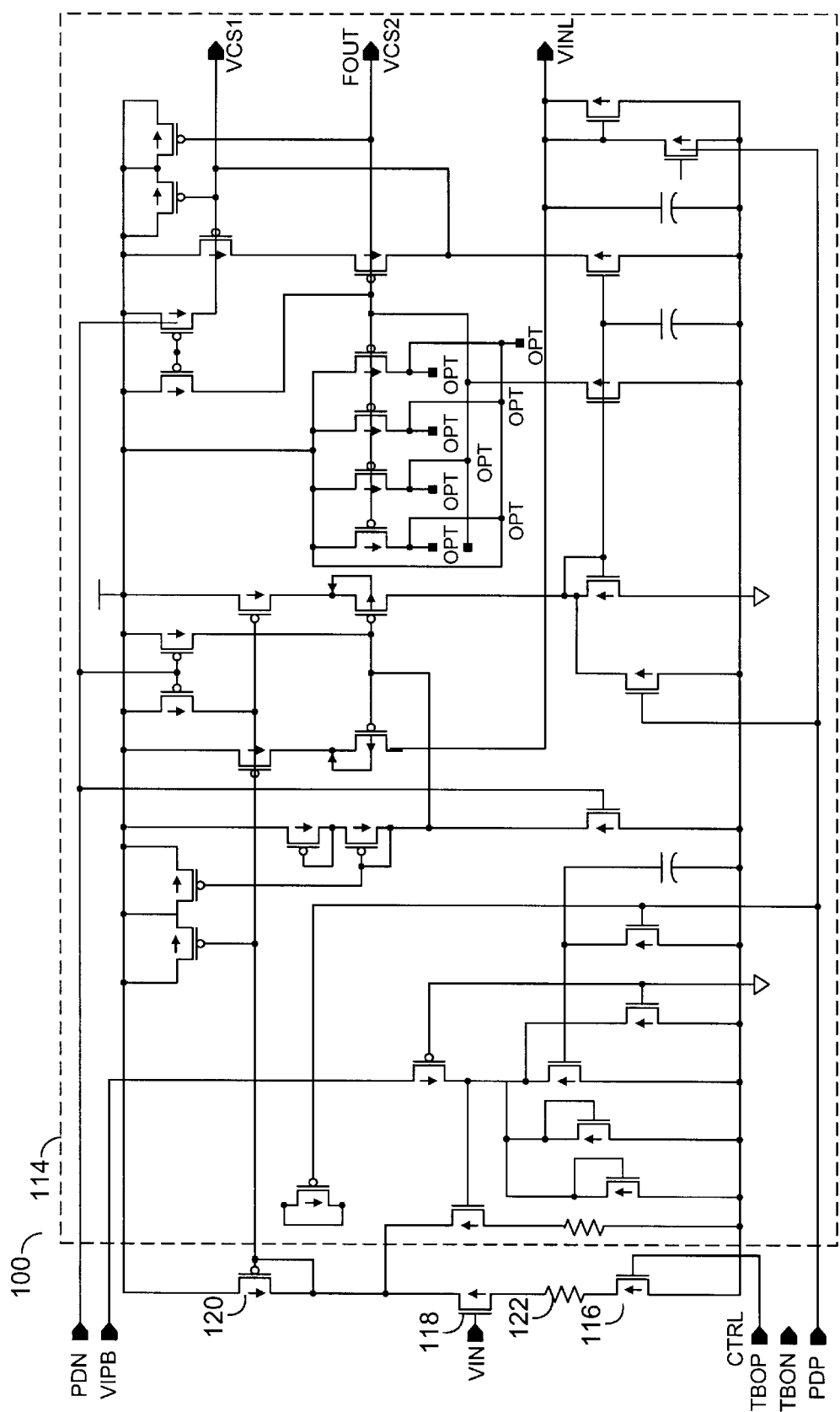
FIG. 14 is a schematic diagram illustrating a transistor implementation of the circuit 100 of FIGS. 8 and 10.

Referring to FIG. 14, a schematic diagram illustrating an example transistor implementation of the circuit 100 is shown. The circuit 100 may be implemented, in one example, by modifying the circuit 10 of FIG. 3. For example, the transistor 116 may be added between the resistor 122 and the ground or reference node 136. The circuit 114 may be implemented similarly to the circuit 12 of FIG. 3.

Figure 15:
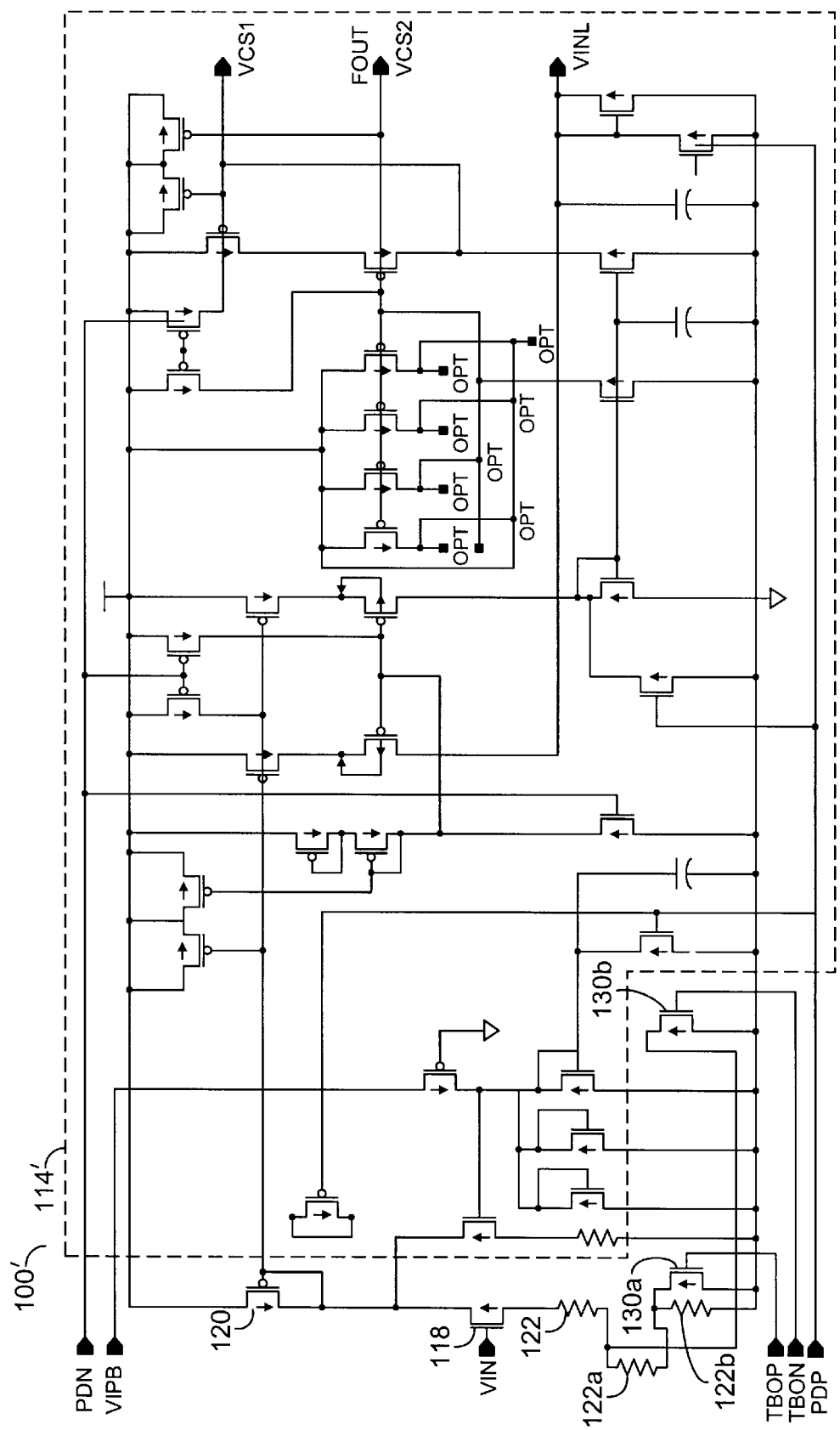
FIG. 15 is a schematic diagram illustrating a transistor implementation of the circuit 100' of FIG. 12.

Referring to FIG. 15, a schematic diagram illustrating an example transistor implementation of the circuit 100' is shown. The circuit 100' is shown implemented with two transistors 130a and 130b and two resistors 132a and 132b. The circuit 114' may be implemented substantially similar to the circuit 12 of FIG. 3.

Figure 16:
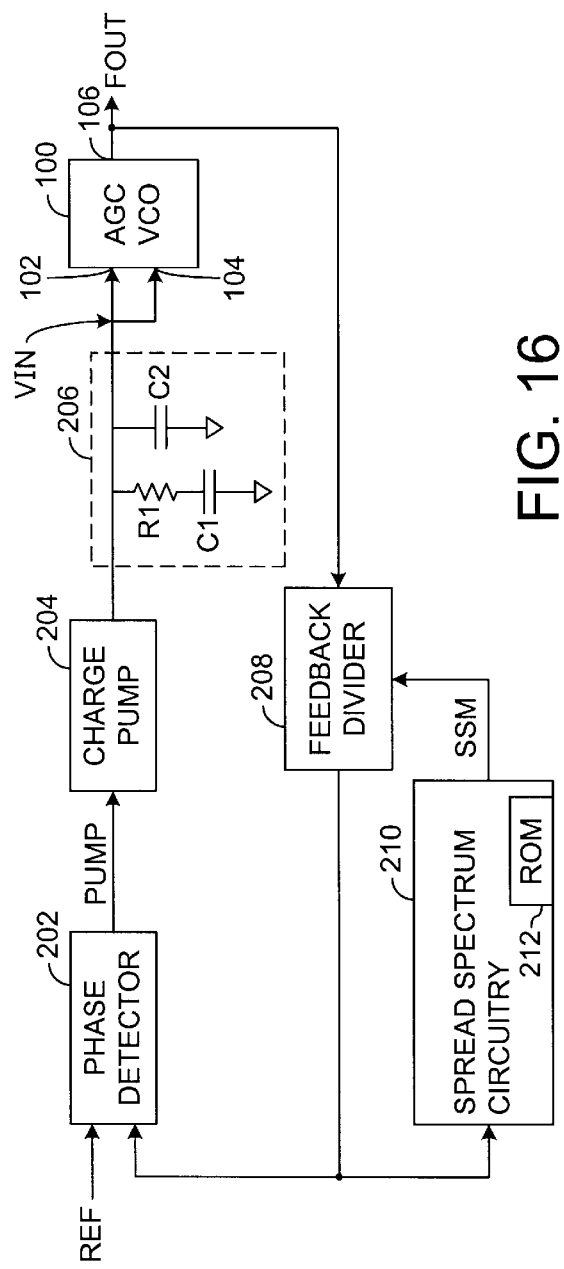
FIG. 16 is a block diagram illustrating the circuit 100 implemented in the context of a phase lock loop circuit.

Referring to FIG. 16, a block diagram illustrating the circuit 100 implemented in the context of a spread spectrum clock generator circuit 200 is shown. The circuit 200 may be configured to generate the signal FOUT in response to a reference signal (e.g., REF). The signal FOUT may be, in one example, a spread spectrum clock signal that may have a mean frequency determined in response to a frequency of the signal REF. When the circuit 200 is implemented with the circuit 100, the circuit 200 may provide optimized spread spectrum modulation over a wide range of frequencies of the signal REF.

The circuit 200 may comprise, in one example, a phase detector 202, a charge pump 204, a loop filter 206, a feedback divider 208, and a spread spectrum circuitry block 210. The signal REF may be presented to a first input of the phase detector 202. A feedback signal (e.g., FEEDBACK) may be presented to a second input of the phase detector 202. The phase detector 202 may have an output that may present a signal (e.g., PUMP) to an input of the charge pump 204. The charge pump 204 may have an output that may present the signal VIN that may be filtered by the loop filter 206. The signal VIN may be present to the inputs 102 and 104 of the circuit 100. The circuit 100 may be configured to generate the signal FOUT in response to the signal VIN.

The signal FOUT may be presented to a first input of the feedback divider 208. A control signal (e.g., SSM) may be presented to a second input of the feedback divider 208. The feedback divider may have an output that may present the signal FEEDBACK in response to the signals FOUT and SSM. The signal FEEDBACK may be presented to an input of the spread spectrum circuitry block 210. The spread spectrum circuitry block 210 may comprise a set of spread spectrum ROM codes 212. The set of ROM codes may have been optimized for a particular mean frequency of the signal FOUT according to predetermined criteria. The spread spectrum circuitry block 210 may be configured to generate the signal SSM in response to the signal FEEDBACK and the set of ROM codes 212.

Figure 17:
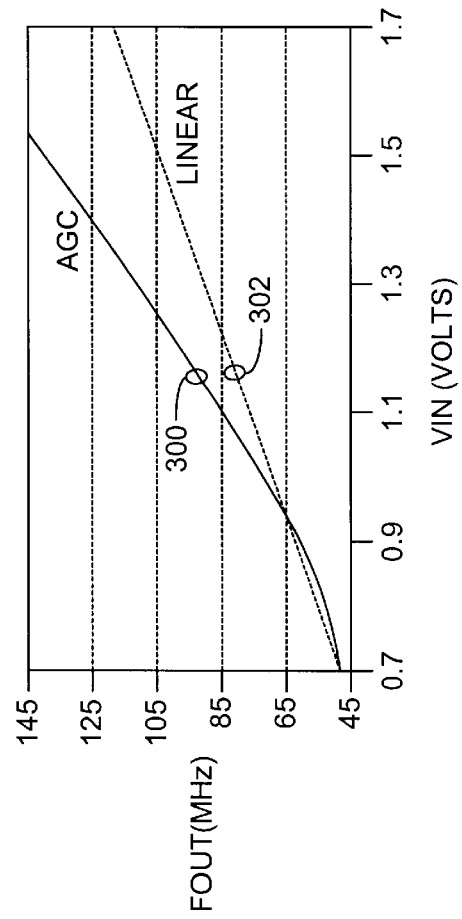
FIG. 17 is a graph illustrating an operation of the present invention.
Figure 18A:
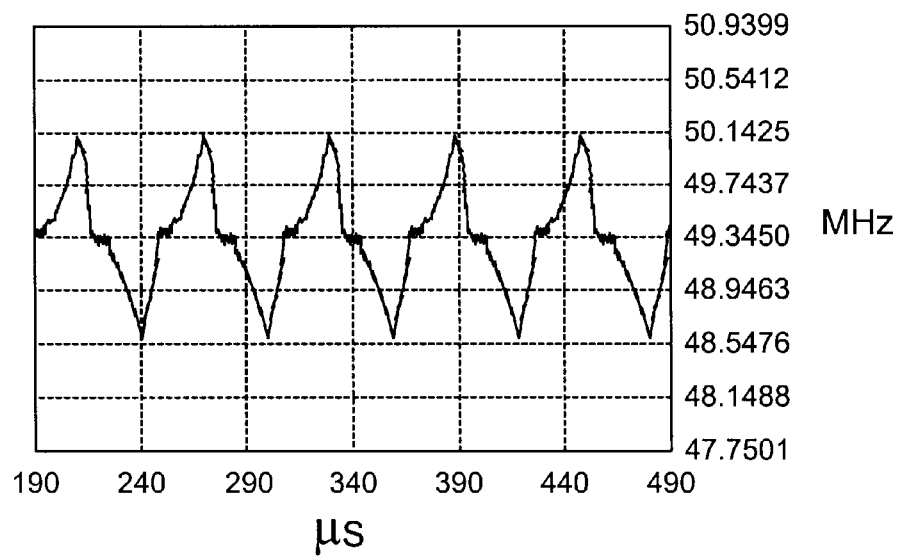
FIGS. 18a–18d are graphs illustrating an example operation of the PLL circuit of FIG. 16 implemented with a linear VCO.
Figure 18B:
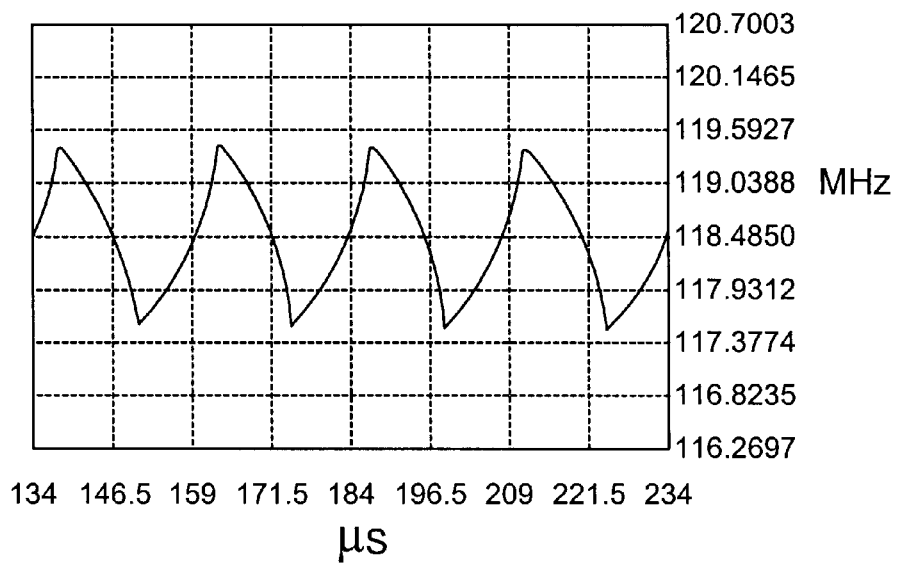
Figure 18C:
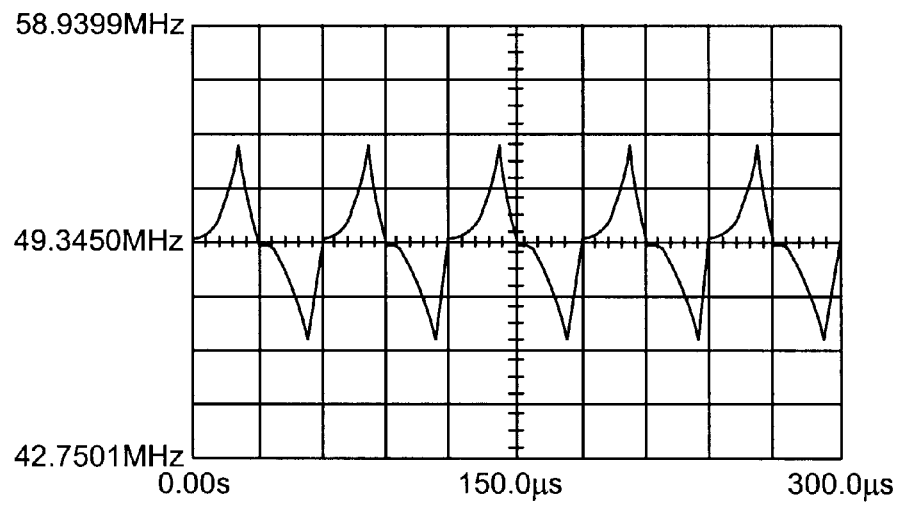
Figure 18D:
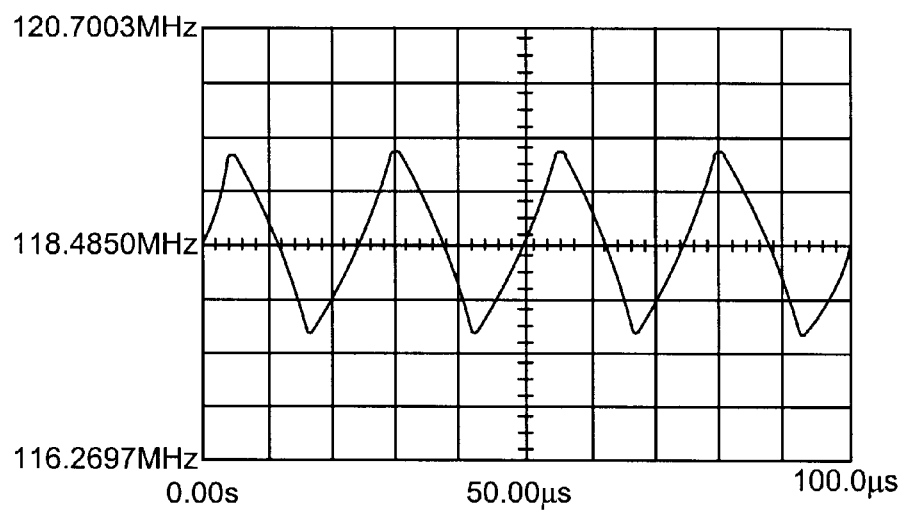
Figure 19A:
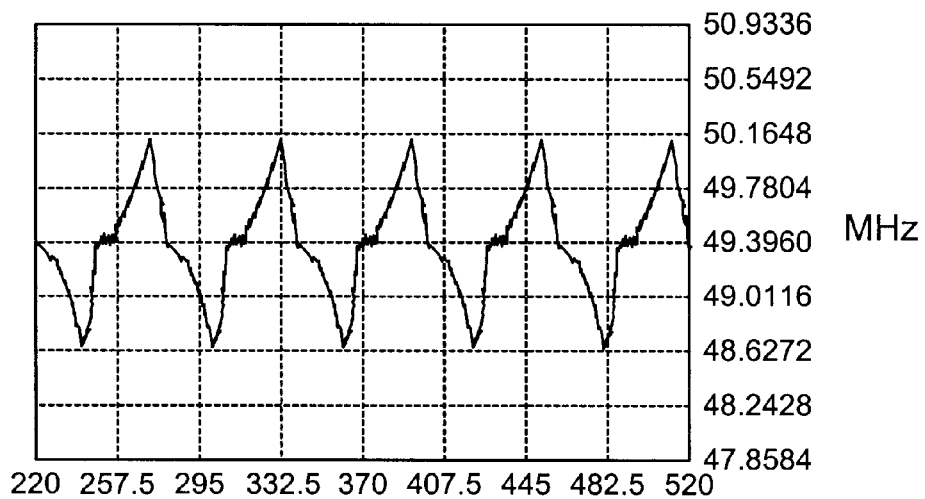
FIGS. 19a–19d are graphs illustrating an example operation of the PLL implemented with a VCO in accordance with the present invention.
Figure 19B:
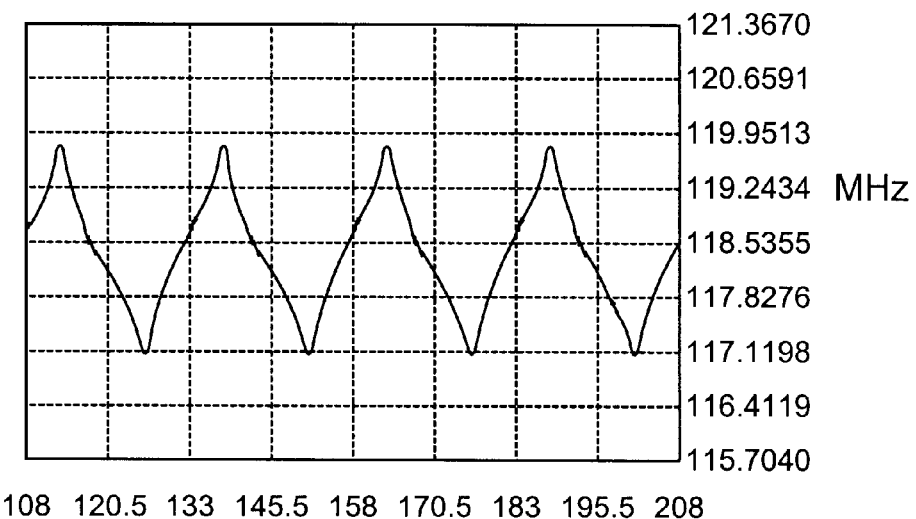
Figure 19C:
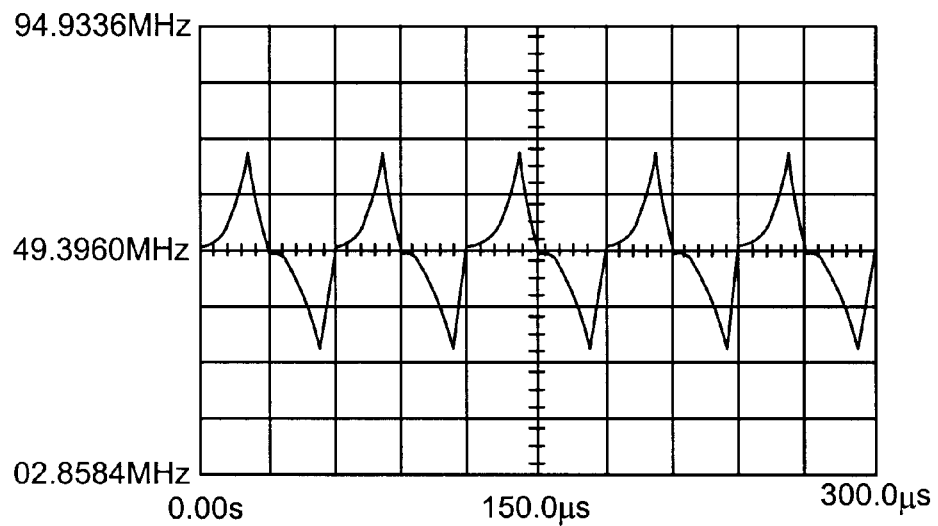
Figure 19D:
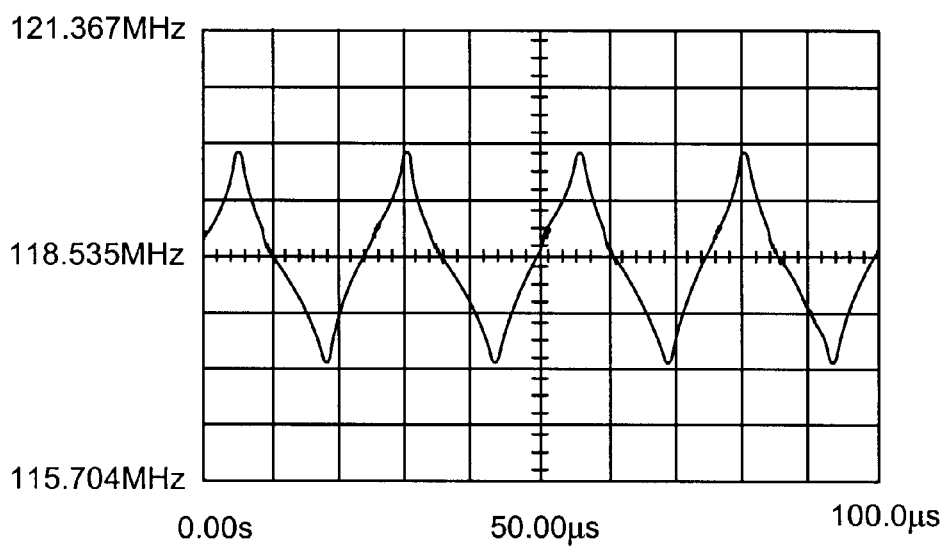

Referring to FIG. 17, a graph illustrating a comparison between examples of the signal FOUT as generated by the circuit 100 (e.g., trace 300) and a linear VCO (e.g., trace 302). The circuit 100 may be configured to generate a wider range of frequencies in response to a predetermined range of input voltages than the linear VCO.

Referring to FIGS. 18a–18d, graphs illustrating example operations of a phase lock loop circuit using a linear VCO are shown. A simulation (e.g., FIGS. 18a and 18b) and measured waveforms (e.g., FIGS. 18c and 18d) illustrate a spread spectrum signal as generated by a phase lock loop circuit implemented with a linear VCO.

Referring to FIGS. 19a–19d, graphs illustrating example operations of a phase lock loop circuit using the circuit 100 are shown. Simulation (e.g., FIGS. 19a and 19b) and measured waveforms (e.g., FIGS. 19c and 19d) illustrate an example of the signal FOUT that may be generated by the circuit 200 of FIG. 16 when implemented with the circuit 100. The circuit 100 may provide improved spread spectrum performance in comparison to a linear VCO.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first circuit configured to generate an output signal having a frequency that varies in response to (i) a voltage signal and (ii) a load; and
    a second circuit configured to generate said load by coupling a terminal of one or more resistive devices to a reference node in response to a control signal.

2. The apparatus according to claim 1, wherein said apparatus has an automatically controlled nonlinear frequency gain with respect to said voltage signal.

3. The apparatus according to claim 1, wherein said apparatus comprises a voltage controlled oscillator with automatic gain control.

4. The apparatus according to claim 1, wherein said first circuit comprises a ring oscillator.

5. The apparatus according to claim 1, wherein said second circuit comprises at least one transistor coupled between an input and said reference node.

6. The apparatus according to claim 5, wherein said transistor is sized to adjust said frequency gain according to predetermined criteria.

7. The apparatus according to claim 5, wherein said control signal is presented to a gate of said transistor.

8. The apparatus according to claim 1, wherein said control signal and said voltage signal are the same.

9. The apparatus according to claim 1, wherein said voltage signal is generated by a first phase lock loop circuit and said control signal is generated by a second phase lock loop circuit.

10. The apparatus according to claim 1, wherein said control signal comprises a digital signal.

11. The apparatus according to claim 10, wherein said digital signal is an I$^2$C signal.

12. The apparatus according to claim 10, wherein said digital signal comprises a number of bits.

13. The apparatus according to claim 12, wherein each bit is presented to a gate of a transistor, wherein said transistor is coupled between said reference node and a terminal of a resistive device.

14. The apparatus according to claim 1, further comprising a third circuit configured to generate said voltage signal, wherein said frequency of said output signal is spread spectrum modulated.

15. An apparatus comprising:
    means for generating an output signal having a frequency that varies in response to (i) a voltage signal and (ii) a load; and
    means for generating said load by coupling a terminal of a resistive device to a reference node in response to a control signal.

16. A method for providing a nonlinear frequency gain in a voltage controlled oscillator comprising the steps of:
    (A) generating an output having a frequency that varies in response to (i) a voltage and (ii) a load; and
    (B) generating said load by coupling a terminal of a resistive device to a reference node in response to a control input.

17. The method according to claim 16, wherein step B comprises the sub-step of:
    (B-1) operating a transistor in a linear region in response to said control input.

18. The method according to claim 16, wherein said step B comprises the sub-step of:
    (B-1) coupling a terminal of two or more resistive devices to a reference node in response to said control input.

19. The method according to claim 18, wherein said step B further comprises the sub-step of:
    (B-2) selecting said terminal in response to a state of a bit of said control input.

20. The method according to claim 16, further comprising the step of:
    (C) modulating said voltage according to predetermined spread spectrum criteria.

* * * * *